(12) United States Patent
Tamura et al.

(10) Patent No.: US 11,287,450 B2
(45) Date of Patent: Mar. 29, 2022

(54) CURRENT SENSOR

(71) Applicant: Alps Alpine Co., Ltd., Tokyo (JP)

(72) Inventors: Manabu Tamura, Miyagi-ken (JP); Naoki Yamamoto, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 16/899,299

(22) Filed: Jun. 11, 2020

(65) Prior Publication Data

US 2020/0300895 A1 Sep. 24, 2020

Related U.S. Application Data

(63) Continuation of application No. PCT/JP2018/045570, filed on Dec. 11, 2018.

(30) Foreign Application Priority Data

Dec. 13, 2017 (JP) .............................. JP2017-238461

(51) Int. Cl.
  *G01R 15/20* (2006.01)
  *G01R 19/00* (2006.01)

(52) U.S. Cl.
  CPC ......... *G01R 15/205* (2013.01); *G01R 15/202* (2013.01); *G01R 15/207* (2013.01); *G01R 19/0092* (2013.01)

(58) Field of Classification Search
  CPC .. G01R 15/205; G01R 15/202; G01R 15/207; G01R 15/20; G01R 19/0092
  See application file for complete search history.

(56) References Cited

U.S. PATENT DOCUMENTS

| | | | |
|---|---|---|---|
| 9,410,991 B2 * | 8/2016 | Masuda | ............... G01R 15/207 |
| 10,267,826 B2 | 4/2019 | Harada | |
| 2013/0320968 A1 * | 12/2013 | Sakamoto | ................ G01R 1/18 |
| | | | 324/244 |

(Continued)

FOREIGN PATENT DOCUMENTS

| | | |
|---|---|---|
| EP | 3176590 | 6/2017 |
| JP | 2007-171156 | 7/2007 |

(Continued)

OTHER PUBLICATIONS

International Search Report and Written Opinion from corresponding International application No. PCT/JP2018/045570, 13pgs. dated Feb. 26, 2019.

*Primary Examiner* — Dominic E Hawkins
(74) *Attorney, Agent, or Firm* — Crowell & Moring LLP

(57) ABSTRACT

A current sensor that can be downsized without lowering measurement precision has bus bars, magnetic sensors, each of which measures an induced magnetic field generated from one bus bar, a circuit board on which the magnetic sensors are mounted, a case that fixes the bus bars and circuit board, a lid that closes the case, and in-side magnetic shields provided in the lid. The in-side magnetic shield has cutouts along its circumferential edges. Hole are formed in the lid. From each hole, the outer edges of the cutout of the in-side magnetic shield are exposed. Therefore, when the lid is formed, the distance between adjacent in-side magnetic shields can be shortened when the in-side magnetic shield is positioned by pressing portions in a mold.

3 Claims, 5 Drawing Sheets

(56) References Cited

U.S. PATENT DOCUMENTS

2017/0018920 A1 1/2017 Watanabe et al.
2017/0343584 A1* 11/2017 Abe ..................... G01R 15/148

FOREIGN PATENT DOCUMENTS

| JP | 2010-181184 | 8/2010 |
| JP | 2012-122793 | 6/2012 |
| JP | 2012-242176 | 12/2012 |
| JP | 2014-092478 | 5/2014 |
| JP | 2015-145838 | 8/2015 |
| JP | 2016-031293 | 3/2016 |
| JP | 2017-026392 | 2/2017 |
| JP | 2017-102022 | 6/2017 |

* cited by examiner

CURRENT SENSOR

CLAIM OF PRIORITY

This application is a Continuation of International Application No. PCT/JP2018/045570 filed on Dec. 11, 2018, which claims benefit of priority to Japanese Patent Application No. 2017-238461 filed on Dec. 13, 2017. The entire contents of each application noted above are hereby incorporated by reference.

BACKGROUND

1. Field of the Disclosure

The present disclosure relates to a current sensor that measures a current flowing in a conductor according to a magnetic field generated by the current.

2. Description of the Related Art

A known current sensor that measures currents flowing in multi-phase conductors includes a plurality of magnetic sensors that detect a magnetic field for each conductor in the relevant phase. In each magnetic sensor, to increase measurement precision, the conductors are covered with a magnetic shield for each phase to shut off external magnetic fields including an induced magnetic field generated by an adjacent conductor.

When conductors are covered with a magnetic shield for each phase in this type of current sensor intended for multi-phase conductors, to stabilize measurement precision in the current sensor, the magnetic shield needs to be precisely positioned with respect to the conductor.

A known magnetic shield of this type is positioned with respect to a conductor (bus bar) by being incorporated into the case of the current sensor when the case is assembled (see, for example, Japanese Unexamined Patent Application Publication No. 2015-145838). With the structure, however, the magnetic shield is not sufficiently fixed. External vibration or the like may generate positional deviation causing measurement precision may be lowered.

In a known current sensor, therefore, the magnetic shield is insert-molded in the lid of the case of the current sensor to integrate the lid and magnetic shield together and to position the magnetic shield with respect to the conductor (bus bar) For example, the current sensor described in Japanese Unexamined Patent Application Publication No. 2017-102022 uses a structure in which a pressing member is brought into contact between two mutual adjacent magnetic shields during insert molding so that the pressing member is pressed against the two magnetic shields between them.

In this structure, however, a space needs to be left to have the pressing member abut between adjacent magnetic shields during insert molding, so the interval between the magnetic shields becomes relatively large. Therefore, although no problem occurs when the current sensor is large, the current sensor may need to be downsized depending on the specifications of a device in which the current sensor is installed.

A possible solution to this is to downsize the current sensor by reducing the size of the magnetic shield. However, if the size of the magnetic shield is reduced, the current sensor may become likely to be affected by an external magnetic field because the reduced size of the magnetic shield is not enough to sufficiently cover the magnetic sensor. Therefore, measurement precision may be lowered.

SUMMARY

The present invention addresses the above situation by providing a current sensor that can be downsized without lowering measurement precision.

A current sensor includes: a plurality of bus bars, each of which is made of an electric conductor; a plurality of magnetic sensors, each of which detects an induced magnetic field generated by a current flowing in one bus bar. The magnetic sensors are mounted on a circuit board. A case, made of a synthetic resin, fixes the bus bars and circuit board. A lid, made of a synthetic resin, houses the circuit board together with the case. A magnetic shield is insert-molded in the lid. The magnetic shield has a plurality of cutouts along its circumferential edges. Holes are formed from which the outer edges of the cutouts of the magnetic shield are exposed.

According to the present invention, when the magnetic shield is insert-molded in the lid, the magnetic shield can be fixed by, for example, making pressing portions formed in a mold abut the cutouts of the magnetic shield. Therefore, the distance between adjacent magnetic shields can be shortened, so the current sensor can be made smaller than the past.

DESCRIPTION OF THE EXEMPLARY EMBODIMENTS

Figure 1:
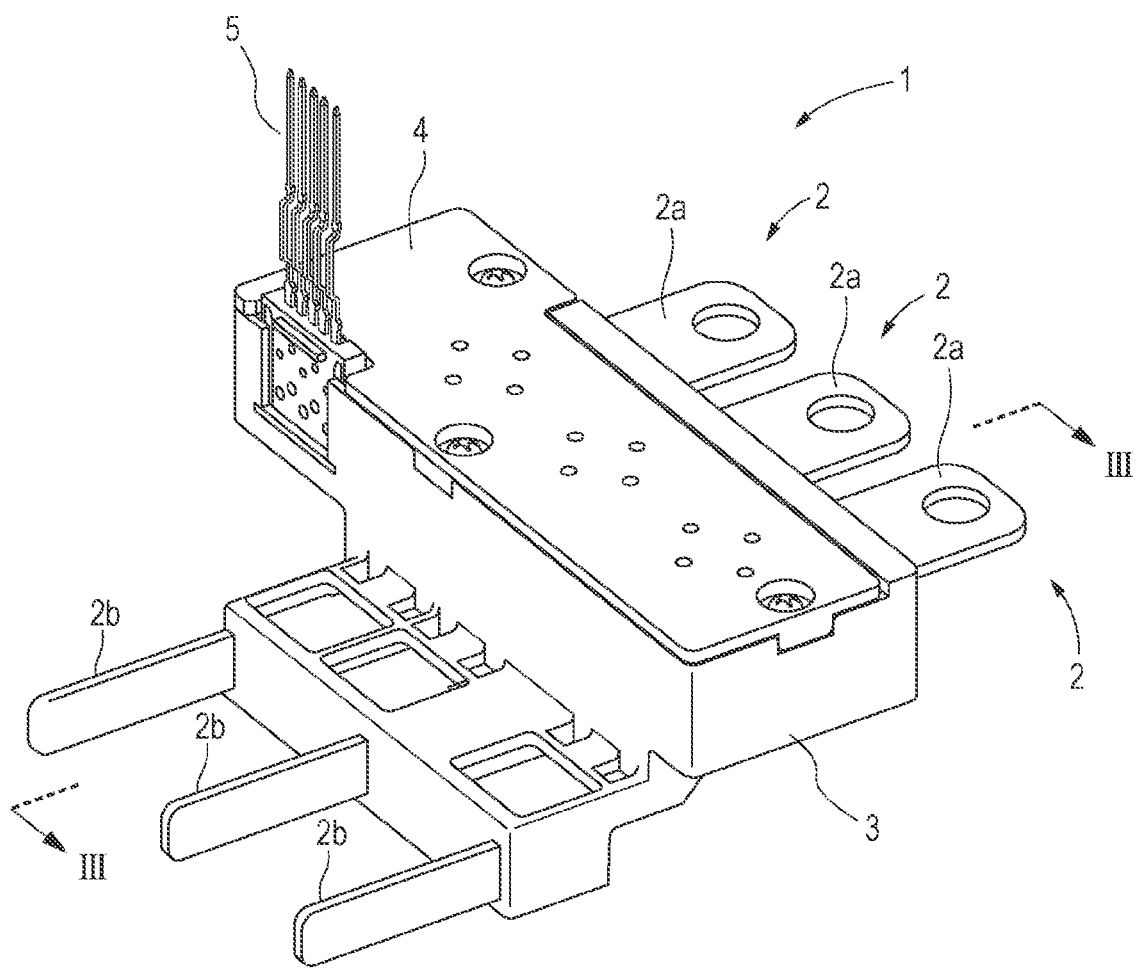
FIG. 1 is a perspective view illustrating the outside shape of a current sensor, which is an example of an embodiment of the present invention.
Figure 2:
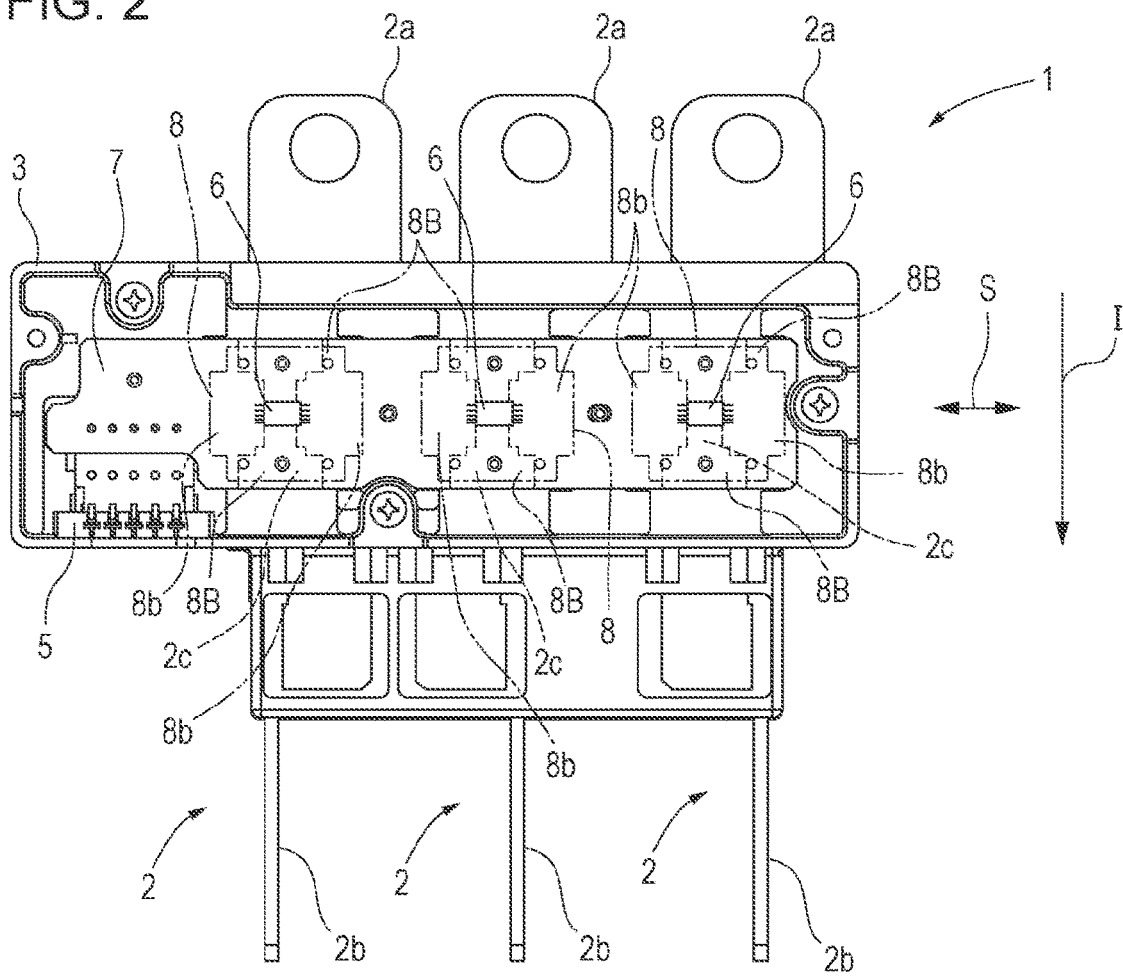
FIG. 2 is an explanatory plan view illustrating a state in which a lid is removed to expose a circuit board.
Figure 3:
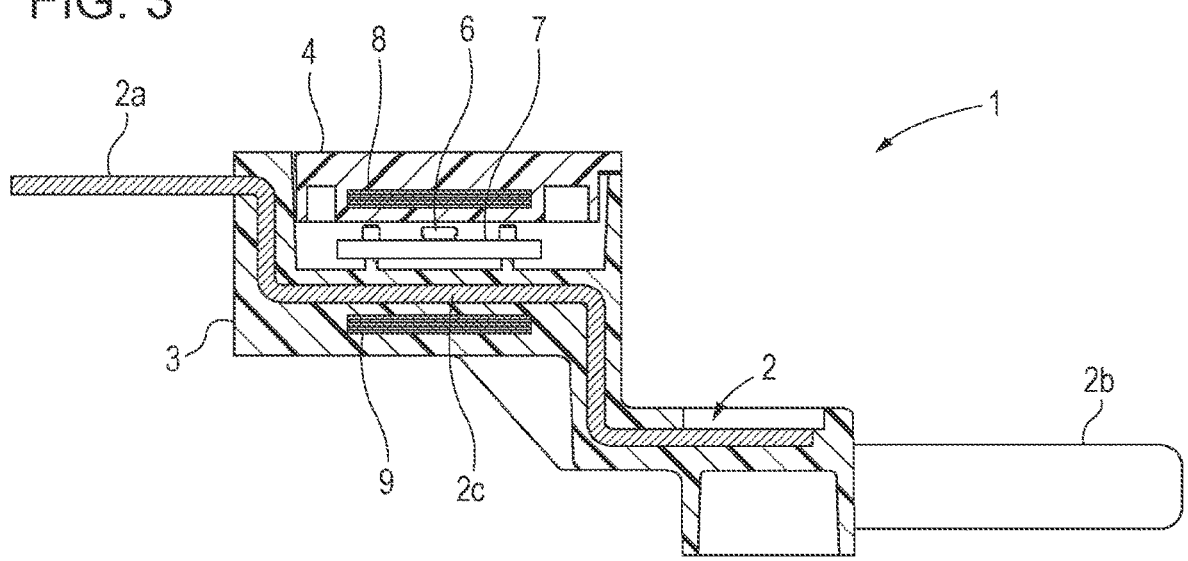
FIG. 3 is a cross-sectional view along line III-III in FIG. 1.

A current sensor 1, which is an example of an embodiment of the present invention will be described with reference to FIGS. 1 to 7. FIG. 1 is a perspective view illustrating the outside shape of the current sensor 1 in this embodiment. FIG. 2 is an explanatory plan view illustrating a state in which a lid 4 of the current sensor 1 in FIG. 1 is removed to expose a circuit board 7. FIG. 3 is a cross-sectional view along line III-III in FIG. 1.

Figure 4:
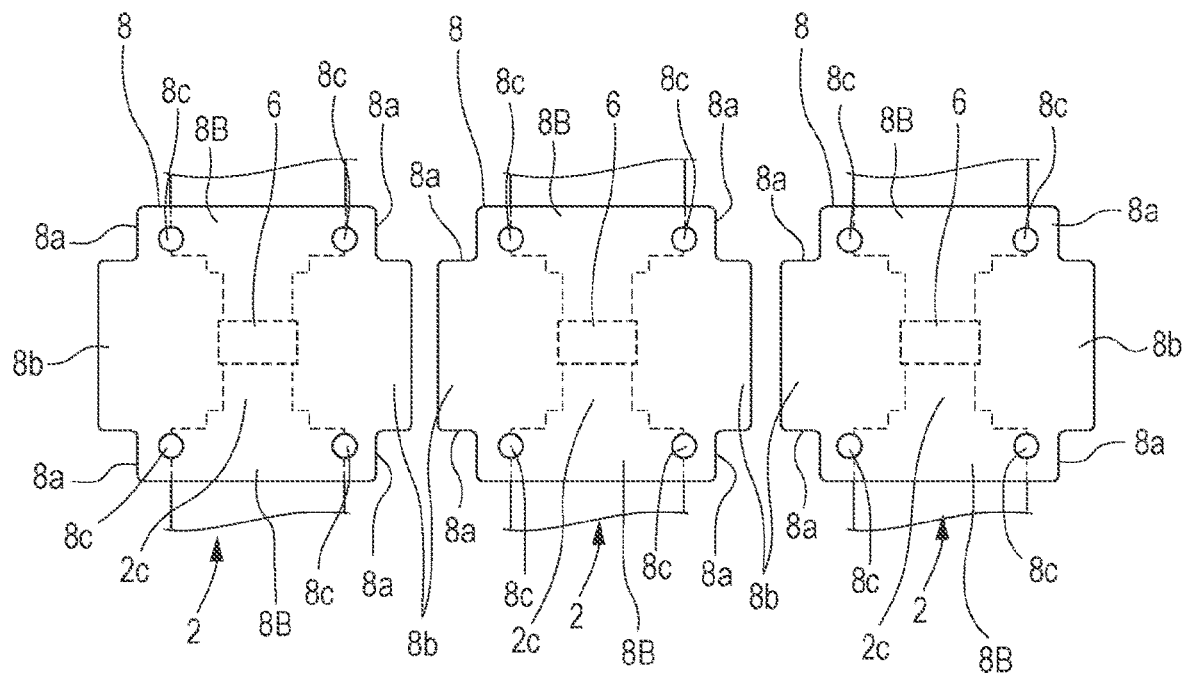
FIG. 4 is an explanatory diagram schematically illustrating a positional relationship between a magnetic sensor and a magnetic shield in plan view with respect to a bus bar.
Figure 5:
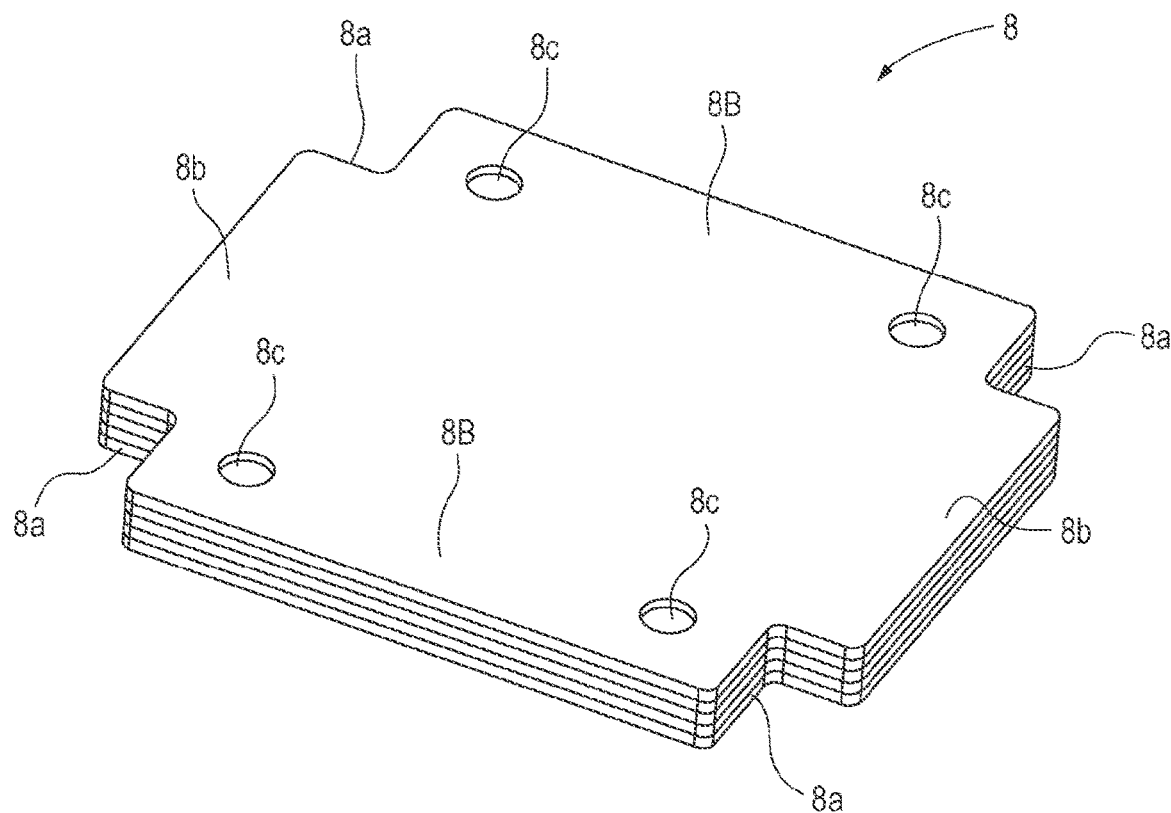
FIG. 5 is a perspective view illustrating the outside shape of the magnetic shield.
Figure 6:
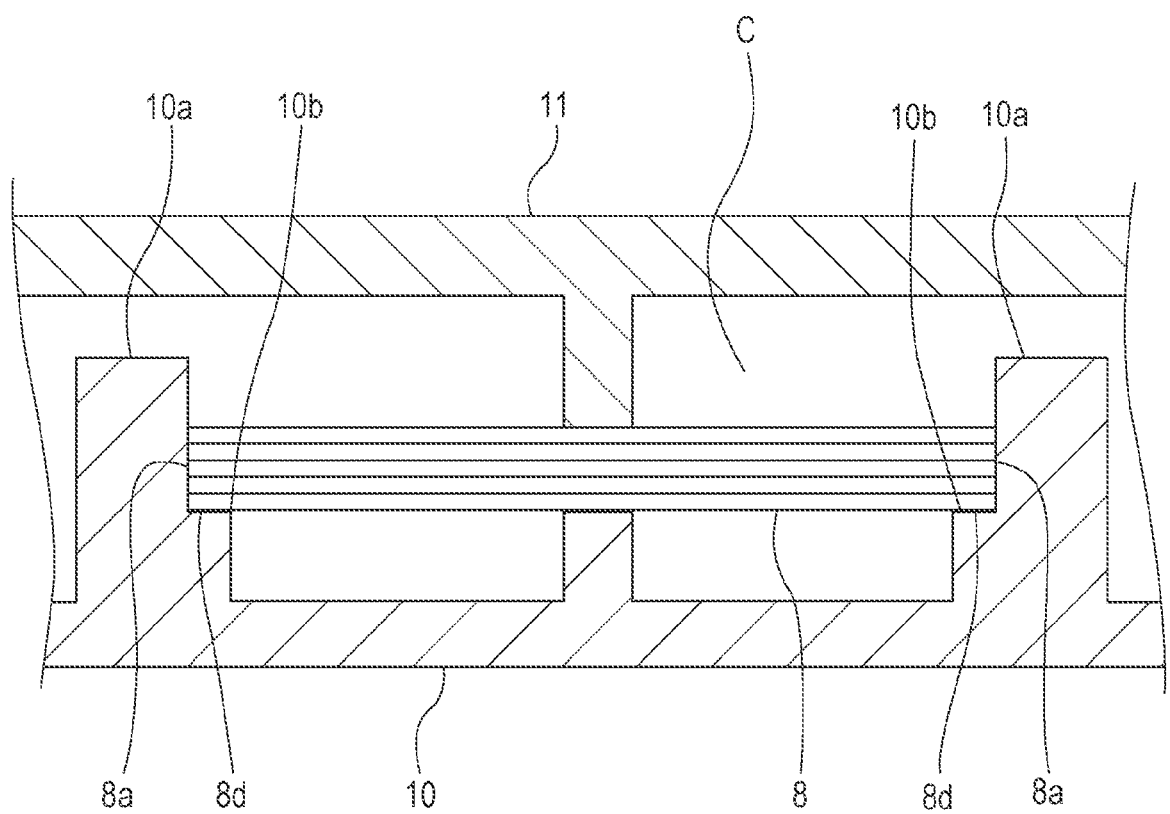
FIG. 6 is an explanatory cross-sectional view illustrating an outline of molds in an injection molding process for the lid.
Figure 7:
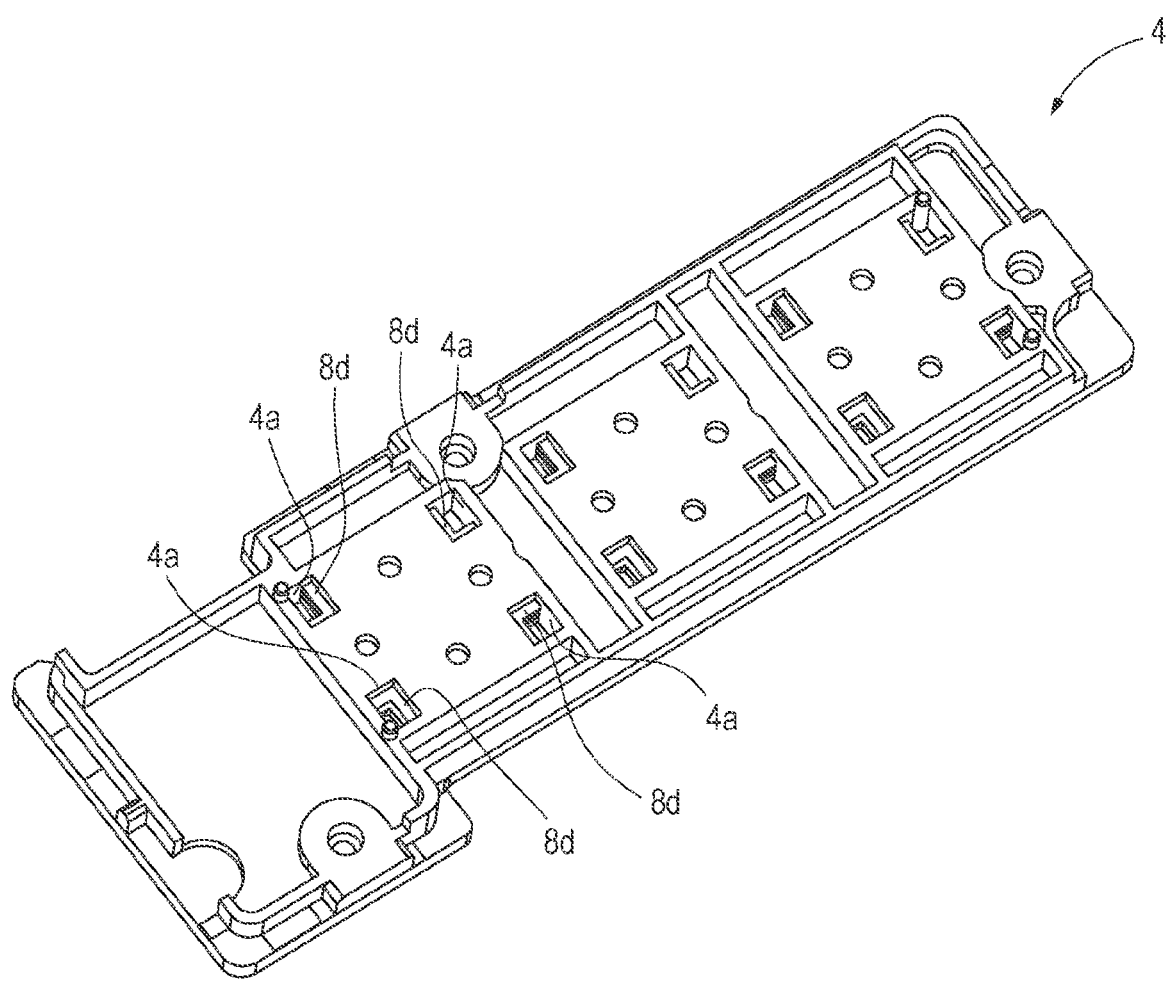
FIG. 7 is a perspective view illustrating the inner surface of the lid.

FIG. 4 is an explanatory diagram schematically illustrating a positional relationship between a magnetic sensor 6 and an in-side magnetic shield 8 in plan view with respect to a bus bar 2. FIG. 5 is a perspective view illustrating the outside shape of the in-side magnetic shield 8. FIG. 6 is an explanatory cross-sectional view illustrating an outline of molds in an injection molding process for the lid 4. FIG. 7 is a perspective view illustrating the inner surface of the lid 4.

As illustrated in FIG. 1, the current sensor 1 in this embodiment has: three bus bars 2 formed from a metal as electric conductors, each bus bar 2 having an input-side terminal 2a and an output-side terminal 2b; a case 3 in a box shape, in which part of the bus bars 2 is accommodated, one side surface (upper surface in the drawing) being open; and a lid 4 that closes the open surface (upper surface in the drawing) of the case 3. This lid 4 houses a circuit board 7, which will be described later, together with the case 3. A member indicated by reference numeral 5 is a connector extending from the circuit board 7, on which magnetic sensors 6, which will be described later, are mounted.

The bus bar 2 is integrally held by the case 3 with an intermediate portion 2c buried in the case 3 made of a synthetic resin, the intermediate portion 2c extending between the input-side terminals 2a and the output-side terminals 2b, as illustrated in FIG. 2. On the bus bar 2, the intermediate portion 2c is at a current detection position at which a current is detected by the magnetic sensor 6. In the intermediate portion 2c, a direction from the input-side terminals 2a to the output-side terminals 2b is a current direction indicated by the arrow I in FIG. 2.

The circuit board 7 is attached and fixed to the inside of the case 3 at a position at which the circuit board 7 overlaps the bus bars 2 with a predetermined spacing left between them, as illustrated in FIG. 3. Three magnetic sensors 6 are mounted on the circuit board 7 in correspondence to their relevant bus bars 2, as illustrated in FIG. 2. The magnetic sensor 6 measures an induced magnetic field generated from the bus bar 2. The magnetic sensor 6 is disposed so that its magnetosensitive surface faces one side surface of the bus bar 2.

The magnetic sensor 6 is placed so that a sensitivity direction S is orthogonal to a current direction I of the bus bar 2, as illustrated in FIG. 2. Not only a magnetoresistance effect element but also other types of elements such as a hall element may be used as the magnetic sensor 6.

The in-side magnetic shield 8 is integrally formed in the lid 4 by insert molding so as to be buried, as illustrated in FIG. 3. The in-side magnetic shield 8 preferably has a rectangular shape in plan view (shape having four edges oriented in different directions spaced at intervals of 90 degrees), around which cutouts 8a are preferably formed at the four corners of the circumferential edges, as illustrated in FIG. 4. Since the cutout 8a preferably has a quadrangular shape (to be accurate, two edges linked at one corner of the quadrangle) in plan view, the in-side magnetic shield 8 has four protrusions 8B, 8B, 8b, and 8b, one between each two adjacent cutouts 8a.

Since, in the in-side magnetic shield 8, the four protrusions 8B, 8B, 8b, and 8b are formed by the cutouts 8a at the four corners, each protrusion being between two cutouts 8a, as indicated in FIG. 4, the in-side magnetic shield 8 preferably has a cross shape in plan view. The in-side magnetic shield 8 is buried in the lid 4 so as to be placed in an orientation in which the two protrusions 8B and 8B positioned on a straight line in one of the two directions of the cross shape preferably protrude along the current direction I of the bus bar 2 and the two protrusions 8b and 8b positioned on a straight line in the other of the two directions of the cross shape protrude along a direction orthogonal to the current direction I of the bus bar 2, as illustrated in FIG. 2.

The in-side magnetic shield 8 is formed so that the length along the direction orthogonal to the current direction I of the bus bar 2 is longer than the length along the current direction I of the bus bar 2.

In the in-side magnetic shield 8, a plurality of metal plates (plate-like magnetic bodies) are preferably stacked in the thickness direction and are preferably linked integrally by caulking portions 8c having a crushed recess formed by caulking, as illustrated in FIG. 5.

The caulking portion 8c is formed in each of the two protrusions 8B and 8B, which protrude along the current direction I of the bus bar 2 when the lid 4 is attached to the case 3, as illustrated in FIG. 4. Since a magnetic flux concentrates at portions at which the length of the in-side magnetic shield 8 is large (specifically, protrusions 8b and 8b), only a small amount of magnetic flux flows in the caulking portions 8c formed at the two protrusions 8B and 8B protruding along the current direction I of the bus bar 2. Although the magnetic flux may be disturbed at the caulking portion 8c, since the magnetic flux flowing in the caulking portions 8c is small, it is possible to suppress a drop in measurement precision due to the presence of the caulking portions 8c.

The lid 4 is formed by injection molding of a synthetic resin material. When the lid 4 is injection-molded, the in-side magnetic shield 8 is sandwiched between a first mold 10 (mold on the lower side in FIG. 6) and a second mold 11 (mold on the upper side in FIG. 6) and is held in a mold space C as illustrated in FIG. 6. The first mold 10 has pressing portions 10a that abut the outer edges of the cutouts 8a at the four corners of the in-side magnetic shield 8.

Since the in-side magnetic shield 8 has cutouts 8a at its four corners, it suffices to provide the first mold 10 with the pressing portions 10a, each of which abuts the relevant cutout 8a. There is no need to provide a pressing portion that abuts throughout the length of the side edge of the in-side magnetic shield 8, unlike, for example, the past. Therefore, the pressing portion 10a of the first mold 10 becomes extremely small, so the distance between mutually adjacent in-side magnetic shields 8 can be shortened accordingly and the current sensor 1 can be downsized.

In the conventional current sensor, for example, the distance between adjacent magnetic shields could not be reduced to 5 mm or less. According to the current sensor 1 in this embodiment, however, the distance between the in-side magnetic shields 8 can be reduced to about 0.5 to 3.0 mm. If the distance between the in-side magnetic shields 8 is reduced too much, however, this is not preferable because the magnetic capacity of the in-side magnetic shield 8 is likely to be saturated.

Since the in-side magnetic shield 8 has a cross shape formed by the cutouts 8a at the four corners in plan view, precision in positioning by the pressing portions 10a is also high. Therefore, the in-side magnetic shield 8 can be fixed so that when the case 3 is closed with the lid 4, each of the two outer edges of the in-side magnetic shield 8 in the sensitivity direction S (width direction of the bus bar 2) highly precisely forms a right angle with respect to the sensitivity direction S of the magnetic sensor 6. Therefore, it becomes hard for the magnetic flux passing through the in-side magnetic shield 8 to bend, making it possible to prevent measurement precision from being lowered.

Furthermore, in the lid 4, holes 4a are formed by the pressing portions 10a of the first mold 10 at portions corresponding to the cutouts 8a of the in-side magnetic shield 8, as illustrated in FIG. 7, in which the inner surface side of the lid 4 is illustrated (the inner surface is on the inner side of the case 3 and is opposite to the circuit board 7). In the hole 4a in the lid 4, an exposed surface 8d exposed along the outer edges of the cutout 8a of the in-side magnetic shield 8 is formed.

The exposed surface 8d is formed when a step 10b formed on the pressing portion 10a of the first mold 10 abuts at an end along the cutout 8a, as illustrated in FIG. 6. When a melted resin flows along the surface of the in-side magnetic shield 8 in the mold space C formed between the first mold 10 and the second mold 11, the melted resin attempts to enter a portion where the pressing portion 10a and an outer edge of the in-side magnetic shield 8 are in mutual contact. At this time, since the step 10b is in contact with a surface along the cutout 8a (the surface is the exposed surface 8d), the flow of the melted resin along the in-side magnetic shield 8 is blocked by the surface with which the step 10b is in contact (the surface is the exposed surface 8d).

Thus, the melted resin does not enter the portion where the pressing portion 10a and the outer edge of the in-side magnetic shield 8 are in mutual contact, so burrs in a thin-plate shape are not formed along the outer edge of the in-side magnetic shield 8. Therefore, the molding quality of the lid 4 in which the in-side magnetic shield 8 is insert-molded is high, and it is possible to prevent burrs from coming off and becoming foreign matter.

In the current sensor 1 in this embodiment, a case-side magnetic shield 9 is buried in the bottom of the case 3 and, when the case 3 is closed with the lid 4, the magnetic sensor 6 is placed between the in-side magnetic shield 8 and the case-side magnetic shield 9, as illustrated in FIG. 3. However, since the in-side magnetic shield 8 is provided, the case-side magnetic shield 9 may not be provided depending on the use environment such as the attachment position of the current sensor 1.

What is claimed is:

1. A current sensor comprising:
    a plurality of bus bars, each of which is made of an electric conductor;
    a plurality of magnetic sensors, each of which detects an induced magnetic field generated by a current flowing in one bus bar;
    a circuit board on which the magnetic sensors are mounted;
    a case made of a synthetic resin, the case fixing the bus bars and the circuit board;
    a lid made of a synthetic resin, the lid housing the circuit board together with the case; and
    a magnetic shield insert-molded in the lid; wherein:
    the magnetic shield has a plurality of cutouts along circumferential edges of the magnetic shield,
    a hole from which an outer edge of the cutouts of the magnetic shield is exposed is formed,
    the magnetic shield has four edges oriented in different directions spaced at intervals of 90 degrees,
    the cutouts are formed at four corners of the magnetic shield,
    the cutout has a quadrangular shape in plan view,
    the magnetic shield has a cross shape in plan view due to four protrusions, each of which is a portion between adjacent cutouts, and
    two protrusions positioned on a straight line in one of two directions of the cross shape protrude along a current direction of the bus bar.

2. The current sensor according to claim 1, wherein:
    in the magnetic shield, a plurality of plate-like magnetic bodies are stacked in a thickness direction and are integrally linked by a caulking portion; and
    in the magnetic shield having a cross shape in plan view, the caulking portions are disposed in the protrusions protruding along the current direction of the bus bar.

3. The current sensor according to claim 1, wherein a partial surface of the magnetic shield is exposed, the partial surface being along the cutout.

* * * * *